United States Patent
Wang et al.

(10) Patent No.: US 11,825,690 B2
(45) Date of Patent: Nov. 21, 2023

(54) DISPLAY APPARATUS HAVING BLIND HOLE IN POLARIZER AND PREPARATION METHOD THEREOF

(71) Applicants: Chengdu BOE Optoelectronics Technology Co., Ltd., Sichuan (CN); BOE Technology Group Co., Ltd., Beijing (CN)

(72) Inventors: Kang Wang, Beijing (CN); Xiaodong Hao, Beijing (CN); Haotian Yang, Beijing (CN); Xiaoxia Liu, Beijing (CN); Renzhe Xu, Beijing (CN); Junhui Yang, Beijing (CN); Bin Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 72 days.

(21) Appl. No.: 17/191,625

(22) Filed: Mar. 3, 2021

(65) Prior Publication Data
US 2021/0367214 A1    Nov. 25, 2021

(30) Foreign Application Priority Data

May 19, 2020   (CN) .......................... 202010422849.3

(51) Int. Cl.
*H10K 50/86* (2023.01)
*G06F 3/041* (2006.01)
(Continued)

(52) U.S. Cl.
CPC .............. *H10K 50/86* (2023.02); *G06F 3/041* (2013.01); *H10K 50/841* (2023.02);
(Continued)

(58) Field of Classification Search
CPC .............. H01L 27/323; H01L 27/3272; H01L 2227/323; H01L 51/5281; H01L 51/524;
(Continued)

(56) References Cited

U.S. PATENT DOCUMENTS

| 2016/0327734 A1 | 11/2016 | Wang et al. |
| 2020/0225394 A1 | 7/2020 | Guo et al. |

FOREIGN PATENT DOCUMENTS

| CN | 104793399 A | 7/2015 |
| CN | 205899447 U | 1/2017 |

(Continued)

OTHER PUBLICATIONS

Office Action dated Aug. 29, 2022 for Chinese Patent Application No. 202010422849.3 and English Translation.

*Primary Examiner* — Matthew E. Gordon
(74) *Attorney, Agent, or Firm* — Ling Wu; Stephen Yang; Ling and Yang Intellectual Property

(57) ABSTRACT

A display apparatus and a preparation method thereof, the display apparatus includes a display panel whose display area has a first hole; a polarizer disposed on one side of the display panel, wherein the polarizer has a blind hole, the blind hole penetrates through an optical characteristic layer in the polarizer, and an orthographic projection of the blind hole on the display panel at least partially overlaps with the first hole; a first optical adhesive layer disposed on a surface of the polarizer away from the display panel, wherein the first optical adhesive layer includes a planar portion and a convex portion, and the convex portion is filled in the blind hole; a cover plate disposed on one side of the first optical adhesive layer away from the display panel.

15 Claims, 1 Drawing Sheet

(51) Int. Cl.
  *H10K 50/84* (2023.01)
  *H10K 59/40* (2023.01)
  *H10K 59/126* (2023.01)
  *H10K 71/00* (2023.01)
  *H10K 59/12* (2023.01)

(52) U.S. Cl.
  CPC ........... *H10K 59/126* (2023.02); *H10K 59/40* (2023.02); *H10K 71/00* (2023.02); *H10K 59/1201* (2023.02)

(58) Field of Classification Search
  CPC ....... H01L 51/56; G06F 3/041; H10K 50/841; H10K 50/842; H10K 50/86; H10K 59/00; H10K 59/1201; H10K 59/126; H10K 59/871; H10K 59/872; H10K 59/8791; H10K 71/00; H10K 71/40; H10K 71/421; H10K 71/441

USPC ......................................................... 257/40
  See application file for complete search history.

(56)  References Cited

FOREIGN PATENT DOCUMENTS

| | | | | |
|---|---|---|---|---|
| CN | 107807468 | A | | 3/2018 |
| CN | 109407198 | A | | 3/2019 |
| CN | 109976029 | A * | 7/2019 | ........... G02B 5/3083 |
| CN | 109976029 | A | | 7/2019 |
| CN | 110133787 | A * | 8/2019 | ........... G02B 5/3041 |
| CN | 110133787 | A | | 8/2019 |
| CN | 110133902 | A | | 8/2019 |
| CN | 209373166 | U | | 9/2019 |
| CN | 110908163 | A | | 3/2020 |
| CN | 111026288 | A | | 4/2020 |

* cited by examiner

DISPLAY APPARATUS HAVING BLIND HOLE IN POLARIZER AND PREPARATION METHOD THEREOF

CROSS-REFERENCE TO RELATED APPLICATION

The present application claims the priority of Chinese Patent Application No. 202010422849.3 filed to the CNIPA on May 19, 2020, the content of which is hereby incorporated by reference.

TECHNICAL FIELD

The present disclosure relates to, but is not limited to, the field of display technology, and particularly to a display apparatus and a preparation method thereof.

BACKGROUND

At present, under-screen cameras have been gradually recognized by mobile phone manufacturers and consumers. A design of AA blind hole (i.e., a blind hole opened in q display area of a display panel) has been gradually adopted, while in order to improve the transmittance at the blind hole, an opening design needs to be applied to a polarizer (POL), and the opening of the POL will bring problems such as poor bonding of bubbles at the opening of the POL and depression in the blind hole area of the display panel during machining processes. Therefore, related technologies still need to be improved.

SUMMARY

The following is a summary of the subject matter described in detail in the present disclosure. This summary is not intended to limit the protection scope of the claims.

In an aspect of the present disclosure, the present disclosure provides a display apparatus. According to an embodiment of the present disclosure, the display apparatus includes a display panel, wherein a display area of the display panel has a first hole; a polarizer disposed on one side of the display panel, wherein the polarizer has a blind hole, the blind hole penetrates through an optical characteristic layer in the polarizer, and an orthographic projection of the blind hole on the display panel at least partially overlaps with the first hole; a first optical adhesive layer disposed on a surface of the polarizer away from the display panel, wherein the first optical adhesive layer includes a planar portion and a convex portion, and the convex portion is filled in the blind hole; a cover plate, wherein the cover plate is disposed on one side of the first optical adhesive layer away from the display panel.

In an exemplary embodiment, a depth of the blind hole is less than or equal to 40% of a thickness of the planar portion.

In an exemplary embodiment, the depth of the blind hole is less than or equal to 25% of the thickness of the planar portion.

In an exemplary embodiment, the polarizer includes a support layer, wherein the support layer is in contact with the first optical adhesive layer; an optical characteristic layer, wherein the optical characteristic layer is disposed on a surface of the support layer away from the first optical adhesive layer; a first adhesive layer, wherein the first adhesive layer is disposed on a surface of the optical characteristic layer away from the first optical adhesive layer; a polarizing layer, wherein the polarizing layer is disposed on a surface of the first adhesive layer away from the first optical adhesive layer; and a second adhesive layer, wherein the second adhesive layer is disposed on a surface of the polarizing layer away from the first optical adhesive layer.

In an exemplary embodiment, the blind hole at least penetrates through the support layer and the optical characteristic layer.

In an exemplary embodiment, the blind hole only penetrates through the support layer and the optical characteristic layer.

In an exemplary embodiment, a content of fully cured gel of the material forming the first optical adhesive layer is greater than 70%.

In an exemplary embodiment, the display apparatus further includes a touch module disposed on a surface of the polarizer away from the cover plate; and a second optical adhesive layer disposed on a surface of the touch module away from the cover plate and in contact with the display panel.

In an exemplary embodiment, the display panel is an OLED display panel.

In an exemplary embodiment, the display panel is an AMOLED display panel.

In an exemplary embodiment, the display panel includes a display substrate, and a light shielding layer, a buffer layer, a thin film transistor array layer, a light emitting component array layer, and an encapsulation layer which are sequentially disposed on the display substrate.

In an exemplary embodiment, the first hole is provided above the display area.

In an exemplary embodiment, a shape of the first hole is a round, a square, or a rectangle with curved short sides.

In another aspect of the present disclosure, the present disclosure provides a method for preparing the aforementioned display apparatus. According to an embodiment of the present disclosure, the method includes bonding a polarizer on one side of a display panel; forming a blind hole on one side of the polarizer away from the display panel; forming a first optical adhesive layer on the surface of the polarizer away from the display panel and in the blind hole; and bonding a cover plate on a surface of the first optical adhesive layer away from the display panel.

In an exemplary embodiment, a method of forming the blind hole includes laser engraving.

In an exemplary embodiment, a method of forming the first optical adhesive layer includes at least one of roller attachment and vacuum cavity attachment.

In an exemplary embodiment, the roller attachment includes at least one of plate adsorption roller attachment and screen adsorption roller attachment.

In an exemplary embodiment, before attaching the polarizer, the method further includes forming a second optical adhesive layer on the surface of the display panel; and bonding a touch module on a surface of the second optical adhesive layer away from the display panel.

In an exemplary embodiment, the step of forming the second optical adhesive layer includes forming the second optical adhesive layer by at least one of roller attachment and vacuum cavity attachment.

In an exemplary embodiment, the roller attachment includes at least one of plate adsorption roller attachment and screen adsorption roller attachment.

Other aspects will become apparent upon reading and understanding accompanying drawings and the detailed description.

DETAILED DESCRIPTION

Embodiments of the present disclosure are described in detail below. The embodiments described below are exemplary and are intended to explain the present disclosure, but should not be construed as limitation on the present disclosure. It should be noted that embodiments in the present disclosure and features in the embodiments may be combined with each other arbitrarily if there is no conflict. The embodiments in which technologies or conditions are not indicated shall be carried out according to technologies or conditions described in literatures in the art or according to a product specification.

Figure 1:
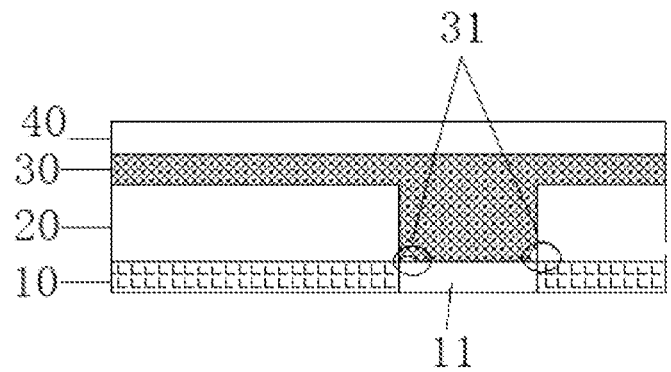
FIG. 1 is a schematic diagram showing a cross-sectional structure of a display apparatus.

Although the AA blind hole has realized a design of the under-screen camera, an opening design needs to be applied to a POL in order to improve the transmittance at the blind hole. If a Thermal-melt Optical Clear Adhesive (TOCA) on a surface of the POL away from the display panel has an opening, when a recoating film is torn off, glue pulling will take place at the opening of POL, which causes bubbles defects. If the TOCA has no opening, during defoaming after bonding, the external pressure is greater than the pressure in the perforated area, which causes depression at the opening of the display panel. At present, a design of TOCA without opening is commonly used in the industry, in which a level difference of the POL opening is filled by the TOCA. However, actual absorption capacity for level difference of TOCA available in the industry is limited, and the level difference that can be filled is far less than the thickness of the thinnest polarizer at present. Meanwhile, because of existence of manufacturing process tolerances and tolerances for device capability and fitting, the level difference of the POL opening cannot be completely filled by the TOCA in actual production, resulting in bonding bubbles 31 in at the POL opening (see the structural schematic diagram of FIG. 1). Regarding this problem, the inventor found by research that the optical characteristic layer has the greatest influence on transmittance in a polarizer, and the transmittance of a blind hole area can be well ensured by opening a hole in the optical characteristic layer. Based on this, the present disclosure proposes to open a hole in a polarizer layer by layer to reasonably control a depth of the hole, so that the opening depth of the polarizer is within a range of the actual absorption capability for level difference of the TOCA, thus the opening area in the polarizer can be completely filled by the TOCA such that the problem of bonding bubbles is improved.

Figure 2:
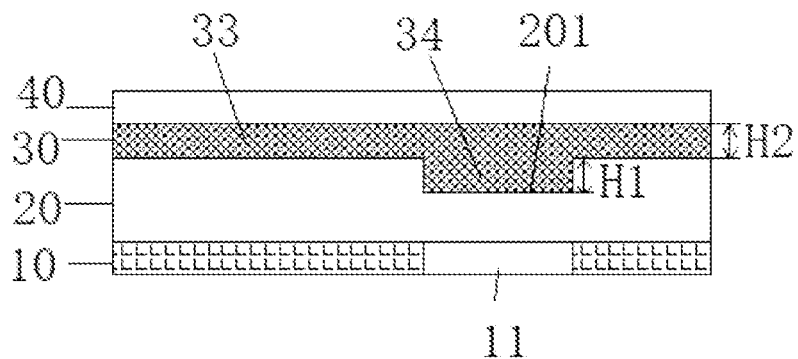
FIG. 2 is a schematic diagram showing cross-sectional structure of a display apparatus according to an embodiment of the present disclosure.

In an aspect of the present disclosure, the present disclosure provides a display apparatus. According to an embodiment of the present disclosure, referring to FIG. 2, a display apparatus includes a display panel 10, wherein a display area of the display panel 10 has a first hole 11; a polarizer 20, wherein the polarizer 20 is disposed on one side of the display panel 10, the polarizer 20 has a blind hole 201, and the blind hole 201 penetrates through an optical characteristic layer in the polarizer, and an orthographic projection of the blind hole on the display panel 10 at least partially overlaps with the first hole 11; a first optical adhesive layer 30, wherein the first optical adhesive layer 30 is disposed on a surface of the polarizer 20 away from the display panel 10, the first optical adhesive layer 30 includes a planar portion 33 and a convex portion 34, and the convex portion 34 is filled in the blind hole 201; a cover plate 40, wherein the cover plate 40 is disposed on one side of the first optical adhesive layer 30 away from the display panel 10.

With the above structure, by reasonably controlling the depth of the blind hole, the blind hole can be completely filled by material forming the first optical adhesive layer in the preparation process, which effectively improves the problem of bonding bubbles at the bottom of the blind hole. At the same time, the blind hole penetrates through the optical characteristic layer which has a major influence on the transmittance in the polarizer, and the transmittance of the opening area can also be effectively ensured, thus effectively realizing a design of an under-screen camera.

In an exemplary embodiment, in order to achieve a better filling effect, the smaller the depth of the blind hole, the better the effect is on the premise of meeting requirements on the light transmittance. In some embodiments, the depth H1 of the blind hole is less than or equal to 40% of a thickness H2 of the planar portion 33, and further, the depth of the blind hole may be less than or equal to 25% of the thickness of the planar portion. For example, the depth of the blind hole is less than or equal to 39%, 38%, 37%, 36%, 35%, 34%, 33%, 32%, 31%, 30%, 29%, 28%, 27%, 26%, 25%, 24%, 23%, 22%, 21%, or 20%, etc, of the thickness of the planar portion. Therefore, the blind hole can be filled more easily by the first optical adhesive layer, the problem of bonding bubbles is avoided, and the production yield is improved.

Figure 3:
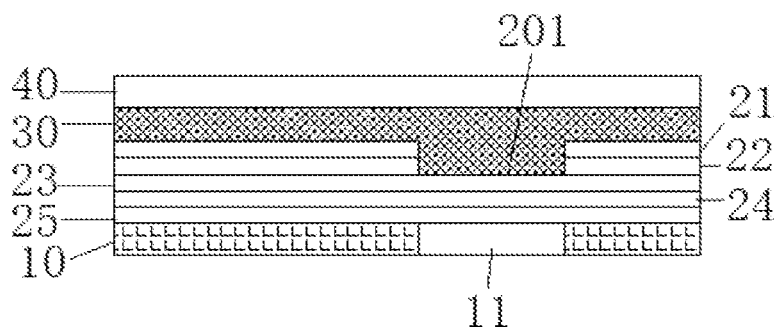
FIG. 3 is a schematic diagram showing cross-sectional structure of a display apparatus according to another embodiment of the present disclosure.

In an exemplary embodiment, the solution of blind hole can be realized by opening a hole in a POL layer by layer. According to some embodiments of the present disclosure, referring to FIG. 3, a polarizer 20 includes a support layer 21, wherein the support layer 21 is in contact with a first optical adhesive layer 30; an optical characteristic layer 22, wherein the optical characteristic layer 22 is disposed on a surface of the support layer 21 away from the first optical adhesive layer 30; a first adhesive layer 23, wherein the first adhesive layer 23 is disposed on a surface of the optical characteristic layer 33 away from the first optical adhesive layer 30; a polarizing layer 24, wherein the polarizing layer 24 is disposed on a surface of the first adhesive layer 23 away from the first optical adhesive layer 30; a second adhesive layer 25, wherein the second adhesive layer 25 is disposed on a surface of the polarizing layer 24 away from the first optical adhesive layer 30; among them, the blind hole 201 at least penetrates through the support layer 21 and the optical characteristic layer 22. Therefore, the optical characteristic layer affecting the light transmittance can be removed in the opening area to ensure the light transmittance of the opening area, and at the same time, the depth of the blind hole can be effectively reduced, so that the blind hole can be completely filled by the optical adhesive in the preparation process, thereby effectively improving the problem of bonding bubbles.

The greater the number of layer structures penetrated by the blind hole in the polarizer, the greater the light transmittance is in the opening area, but the larger the depth of the blind hole is, the more difficult it is to fill the blind hole with the optical adhesive. Based on this, the number of layer structures penetrated by the blind hole can be selected according to actual situations. In some exemplary embodiments, referring to FIG. 3, the blind hole 201 only penetrates through the support layer 21 and the optical characteristic layer 22. Therefore, the depth of the blind hole can be minimized, and the effect of improving the bonding bubbles is ameliorated.

In an exemplary embodiment, a content of fully cured gel of the material forming the first optical adhesive layer is greater than 70% (such as 71%, 72%, 75%, 78%, 80%, 82%, 85%, 88% or 90%, etc.). Therefore, the optical adhesive material has good fluidity, and has strong capability of absorbing level difference, which is beneficial to improving the problem of bonding bubbles.

In an exemplary embodiment, the type of the display panel is not particularly limited, and may be an OLED (Organic Light Emitting Diode) display panel, such as an AMOLED (Active Matrix/Organic Light Emitting Diode) display panel. The structure of the display panel may include, for example, a display substrate, and a light shielding layer, a buffer layer, a thin film transistor array layer, a light emitting component array layer, an encapsulation layer, etc which are sequentially disposed on the display substrate. The display panel may also include other structures, which are not described in detail here.

In an exemplary embodiment, arrangement position, size or the like of a first hole in the display panel can be flexibly adjusted according to needs of the camera, for example, the first hole may be set above the display area, and its shape can be round, square, rectangle with curved short side, other regular or irregular shapes, etc. Generally, on the premise of meeting light transmission requirements of the camera, the smaller the size of the hole, the better, thus the effective display area is larger, which is beneficial to improving the user experience and perception.

In an exemplary embodiment, the display apparatus further includes a touch module disposed on a surface of the polarizer away from the cover plate; a second optical adhesive layer disposed on a surface of the touch module away from the cover plate and in contact with the display panel.

In another aspect of the present disclosure, the present disclosure provides a method for preparing any of the above display apparatuses. According to an embodiment of the present disclosure, the method includes bonding a polarizer on one side of a display panel; forming a blind hole on one side of the polarizer away from the display panel; forming a first optical adhesive layer on the surface of the polarizer away from the display panel and in the blind hole; and bonding a cover plate on a surface of the first optical adhesive layer away from the display panel.

The method is simple in steps and convenient to operate, and the blind hole can be completely filled by the first optical adhesive layer, so that the problem of bonding bubbles at the bottom of the blind hole is significantly improved, thus the preparation yield is improved, and the production cost is reduced.

In an exemplary embodiment, the step of forming the blind hole includes forming the blind hole by laser engraving. The step of forming the first optical adhesive layer includes forming the first optical adhesive layer by at least one of roller attachment and vacuum cavity attachment. In an exemplary embodiment, the roller attachment includes at least one of plate adsorption roller attachment and screen adsorption roller attachment. The plate adsorption roller attachment is to place a product to be formed with the first optical adhesive layer on a lower platform, position and fix the product, and place the first optical adhesive layer on an upper platform with a certain angle between the upper platform and the lower platform, and then press down a rubber roller so that a start position is attached first, then the upper and lower platforms move with respect to each other, and the first optical adhesive layer slides on the upper platform and is attached to the product to be formed with the first optical adhesive layer. The screen adsorption roller attachment is to place a product to be formed with the first optical adhesive layer on a lower platform, position and fix the product, vacuumize a closed cavity with air permeable elastic screen, adsorb and fix the first optical adhesive layer on the screen, then lower the closed cavity to a certain height, and a roller presses down from a side of the screen away from the first optical adhesive layer and moves along the attachment direction, so that attachment of the first optical adhesive layer is completed. The vacuum cavity attachment is to place the product to be formed with the first optical adhesive layer in a cavity, place the first optical adhesive layer in another cavity, then close the two cavities to make the first optical adhesive layer contact with the product to be formed with the first optical adhesive layer, and then make the first optical adhesive layer attached by vacuumizing the closed space formed by closing the two cavities. The first optical adhesive layer can be attached better by manners such as auxiliary pressurization and heating according to needs. In an exemplary embodiment, a film layer is formed in advance by the first optical adhesive layer, the surface film layer is flexible, not fixed, and internal colloid has fluidity before being solidified. During the attachment, due to the extrusion force, the internal colloid will flow and fill the blind hole in the polarizer, and will be solidified after the attachment is completed, so that the blind hole can be well filled by the first optical adhesive layer.

In an exemplary embodiment, before attaching the polarizer, the method further includes forming a second optical adhesive layer on the surface of the display panel; and bonding a touch module on a surface of the second optical adhesive layer away from the display panel. In an exemplary embodiment, the method of forming the second optical adhesive layer may be the same as the method of forming the first optical adhesive layer, which will not be described in detail here, and the structure of the touch module may be structure of any known touch module, which will not be described in detail.

In the description of the present disclosure, the terms "first" and "second" are used for description purposes only, and cannot be interpreted as indicating or implying relative importance or implicitly indicating the quantity of technical features referred to. Thus, features defined by "first" and "second" may include one or more of the features explicitly or implicitly. In the description of the present disclosure, the meaning of "a plurality of" is two or more than two, unless defined otherwise explicitly.

In the description of the present disclosure, description made with reference to terms "an embodiment", "some embodiments", "an example", "a specific example" or "some examples" means that a feature, structure, material, or characteristic described in connection with the embodiment or example is included in at least one embodiment or example of the present disclosure. In the present disclosure, the schematic expression of the above-mentioned terms is not necessarily directed to the same embodiment or example. Moreover, the feature, structure, material, or characteristic described may be combined in a proper way in any one or more embodiments or examples. In addition, those skilled in the art may incorporate and combine different embodiments or examples and features of the different embodiments or examples described in the present disclosure without conflict.

Although the embodiments of the present disclosure have been shown and described above, but the above embodiments are exemplary, and will not be understood as limitations on the present invention. Alterations, modifications, substitutions and variations to the above embodiments may be made by those skilled in the art within the scope of the present disclosure.

What is claimed is:

1. A display apparatus, comprising:
   a display panel, a display area of the display panel having a first hole;
   a polarizer disposed on one side of the display panel, wherein the polarizer has a blind hole, the blind hole penetrates through an optical characteristic layer in the polarizer, and an orthographic projection of the blind hole on the display panel at least partially overlaps with the first hole;
   a first optical adhesive layer disposed on a surface of the polarizer away from the display panel, wherein the first optical adhesive layer comprises a planar portion and a convex portion, and the convex portion is filled in the blind hole; and
   a cover plate disposed on one side of the first optical adhesive layer away from the display panel;
   wherein the polarizer comprises:
      a support layer, wherein the support layer is in contact with the first optical adhesive layer;
      an optical characteristic layer, wherein the optical characteristic layer is disposed on a surface of the support layer away from the first optical adhesive layer;
      a first adhesive layer, wherein the first adhesive layer is disposed on a surface of the optical characteristic layer away from the first optical adhesive layer;
      a polarizing layer, wherein the polarizing layer is disposed on a surface of the first adhesive layer away from the first optical adhesive layer; and
      a second adhesive layer, wherein the second adhesive layer is disposed on a surface of the polarizing layer away from the first optical adhesive layer;
   wherein the blind hole penetrates through the support layer and the optical characteristic layer; the first adhesive layer, the polarizing layer, and the second adhesive layer are stacked between the blind hole and the first hole.

2. The display apparatus according to claim 1, wherein a depth of the blind hole is less than or equal to 40% of a thickness of the planar portion.

3. The display apparatus according to claim 2, wherein the depth of the blind hole is less than or equal to 25% of the thickness of the planar portion.

4. The display apparatus according to claim 1, wherein at least one of a percentage mass or percentage volume of fully cured gel of material forming the first optical adhesive layer is greater than 70%.

5. The display apparatus according to claim 1, wherein the display panel is an Organic Light Emitting Diode (OLED) display panel.

6. The display apparatus according to claim 5, wherein the display panel is an Active Matrix/Organic Light Emitting Diode (AMOLED) display panel.

7. The display apparatus according to claim 1, wherein the first hole is disposed above the display area.

8. The display apparatus according to claim 7, wherein a shape of the first hole is a round, a square, or a rectangle with curved short sides.

9. A method for preparing a display apparatus, comprising:
   forming a polarizer disposed on one side of a display panel; wherein a display area of the display panel has a first hole;
   forming a blind hole disposed on one side of the polarizer away from the display panel; wherein the blind hole penetrates through an optical characteristic layer in the polarizer, and an orthographic projection of the blind hole on the display panel at least partially overlaps with the first hole;
   forming a first optical adhesive layer disposed on a surface of the polarizer away from the display panel and in the blind hole; wherein the first optical adhesive layer comprises a planar portion and a convex portion, and the convex portion is filled in the blind hole; and
   forming a cover plate disposed on one side of the first optical adhesive layer away from the display panel;
   wherein the polarizer comprises:
      a support layer, wherein the support layer is in contact with the first optical adhesive layer;
      an optical characteristic layer, wherein the optical characteristic layer is disposed on a surface of the support layer away from the first optical adhesive layer;
      a first adhesive layer, wherein the first adhesive layer is disposed on a surface of the optical characteristic layer away from the first optical adhesive layer;
      a polarizing layer, wherein the polarizing layer is disposed on a surface of the first adhesive layer away from the first optical adhesive layer; and
      a second adhesive layer, wherein the second adhesive layer is disposed on a surface of the polarizing layer away from the first optical adhesive layer;
   wherein the blind hole penetrates through the support layer and the optical characteristic layer; the first adhesive layer, the polarizing layer, and the second adhesive layer are stacked between the blind hole and the first hole.

10. The method according to claim 9, wherein the step of forming the blind hole comprises forming the blind hole by laser engraving.

11. The method according to claim 9, wherein the step of forming the first optical adhesive layer comprises forming the first optical adhesive layer by at least one of roller attachment and vacuum cavity attachment.

12. The method according to claim 11, wherein the roller attachment comprises at least one of plate adsorption roller attachment and screen adsorption roller attachment.

13. The method according to claim 9, wherein before the step of bonding the polarizer, the method further comprises:
   forming a second optical adhesive layer on a surface of the display panel; and
   bonding a touch module on a surface of the second optical adhesive layer away from the display panel.

14. The method according to claim 13, wherein the step of forming the second optical adhesive layer comprises forming the second optical adhesive layer by at least one of roller attachment and vacuum cavity attachment.

15. The method according to claim 14, wherein the roller attachment comprises at least one of plate adsorption roller attachment and screen adsorption roller attachment.

* * * * *